United States Patent
Tuan et al.

(10) Patent No.: US 9,681,592 B2
(45) Date of Patent: *Jun. 13, 2017

(54) STRUCTURAL CONCRETE MIX FOR CONSTRUCTION FOR ELECTROMAGNETIC WAVE/PULSE SHIELDING

(71) Applicant: The Board of Regents of the University of Nebraska, Lincoln, NE (US)

(72) Inventors: Christopher Tuan, Omaha, NE (US); Lim Nguyen, Bellevue, NE (US)

(73) Assignee: NUtech Ventures, Lincoln, NE (US)

(*) Notice: Subject to any disclaimer, the term of this patent is extended or adjusted under 35 U.S.C. 154(b) by 0 days.

This patent is subject to a terminal disclaimer.

(21) Appl. No.: 14/392,258

(22) PCT Filed: Jun. 24, 2014

(86) PCT No.: PCT/US2014/043875
§ 371 (c)(1),
(2) Date: Dec. 24, 2015

(87) PCT Pub. No.: WO2014/210007
PCT Pub. Date: Dec. 31, 2014

(65) Prior Publication Data
US 2016/0234977 A1  Aug. 11, 2016

Related U.S. Application Data

(63) Continuation-in-part of application No. 14/607,594, filed on Jan. 28, 2015, now Pat. No. 9,278,887, which
(Continued)

(51) Int. Cl.
*H05K 9/00* (2006.01)
*C04B 28/04* (2006.01)
(Continued)

(52) U.S. Cl.
CPC ........... *H05K 9/0003* (2013.01); *C04B 28/04* (2013.01); *E04B 1/92* (2013.01); *H01B 1/16* (2013.01);
(Continued)

(58) Field of Classification Search
CPC .......... H05K 9/0003; H01B 1/16; H01B 1/18; C04B 28/04; C04B 2111/00258;
(Continued)

(56) References Cited

U.S. PATENT DOCUMENTS 2,334,355 A * 11/1943 Russell .................. E04B 1/215
14/3
2,868,659 A   1/1959 Scripture, Jr.
(Continued)

FOREIGN PATENT DOCUMENTS

| CN | 101030454 | 9/2007 |
|---|---|---|
| JP | 06240843 | 8/1994 |
| WO | 0240799 | 5/2002 |

OTHER PUBLICATIONS

Notification of Transmittal of the International Search Report and the Written Opinion of the International Searching Authority—Oct. 14, 2014.
(Continued)

*Primary Examiner* — Jeannette E Chapman
(74) *Attorney, Agent, or Firm* — Harness, Dickey & Pierce, P.L.C.

(57) ABSTRACT

Conductive concrete mixtures are described that are configured to provide EMP shielding and reflect and/or absorb, for instance, EM waves propagating through the conductive concrete mixture. The conductive concrete mixtures include cement, water, conductive carbon material, magnetic material, and metallic conductive material. The conductive carbon material may include conductive carbon particles, con-
(Continued)

ductive carbon powder, and/or coke breeze. The metallic conductive material may include steel fibers, and the magnetic material may include taconite. The conductive concrete mixture may also include supplementary cementitious materials (SCM). A method of making a concrete structure includes pouring a concrete mixture to form conductive concrete, and positioning a first conductive screen within the conductive concrete proximate to an exterior surface of the conductive concrete. The method also includes positioning a second conductive screen within the conductive concrete in electrical contact with the first conductive screen.

25 Claims, 10 Drawing Sheets

Related U.S. Application Data is a continuation of application No. 13/472,670, filed on May 16, 2012, now Pat. No. 8,968,461.

(60) Provisional application No. 61/486,351, filed on May 16, 2011, provisional application No. 61/838,421, filed on Jun. 24, 2013.

(51) Int. Cl.
  *E04B 1/92* (2006.01)
  *H01B 1/16* (2006.01)
  *H01B 1/18* (2006.01)
  *C04B 111/00* (2006.01)
  *C04B 111/94* (2006.01)

(52) U.S. Cl.
  CPC ...... *H01B 1/18* (2013.01); *C04B 2111/00258* (2013.01); *C04B 2111/94* (2013.01); *E04B 2001/925* (2013.01); *Y02W 30/94* (2015.05)

(58) Field of Classification Search
  CPC .. C04B 2111/94; E04B 1/92; E04B 2001/925; Y02W 30/94
  See application file for complete search history.

(56) References Cited

U.S. PATENT DOCUMENTS

| | | | |
|---|---|---|---|
| 3,207,705 A | | 9/1965 | Hall |
| 3,475,304 A | * | 10/1969 | Currey ................ C23F 13/10 204/196.3 |
| 3,721,058 A | * | 3/1973 | Dewey, Jr. ............ B63B 1/041 52/251 |
| 5,312,526 A | * | 5/1994 | Miller ................ B28B 23/04 204/515 |
| 5,346,547 A | | 9/1994 | McCormack |
| 5,392,580 A | * | 2/1995 | Baumann ............ B21F 27/125 52/646 |
| 5,422,174 A | | 6/1995 | Shintani et al. |
| 6,214,454 B1 | | 4/2001 | Kanda et al. |
| 6,503,318 B2 | | 1/2003 | Pye et al. |
| 6,821,336 B1 | | 11/2004 | Ramme |
| 7,578,881 B2 | | 8/2009 | Ramme |
| 8,067,084 B2 | | 11/2011 | Yoshikawa et al. |
| 8,617,309 B1 | | 12/2013 | Carney et al. |
| 2002/0162484 A1 | | 11/2002 | Ramme |
| 2007/0039277 A1 | * | 2/2007 | Mossbeck ............ E04C 5/0627 52/649.1 |
| 2012/0227630 A1 | | 9/2012 | Gray |
| 2012/0324811 A1 | | 12/2012 | Kawase |

OTHER PUBLICATIONS

English Translation of Office Action dated Jan. 25, 2017 from Chinese Patent Office for Chinese Patent Application No. 201480046827.4; 7 pages.

* cited by examiner

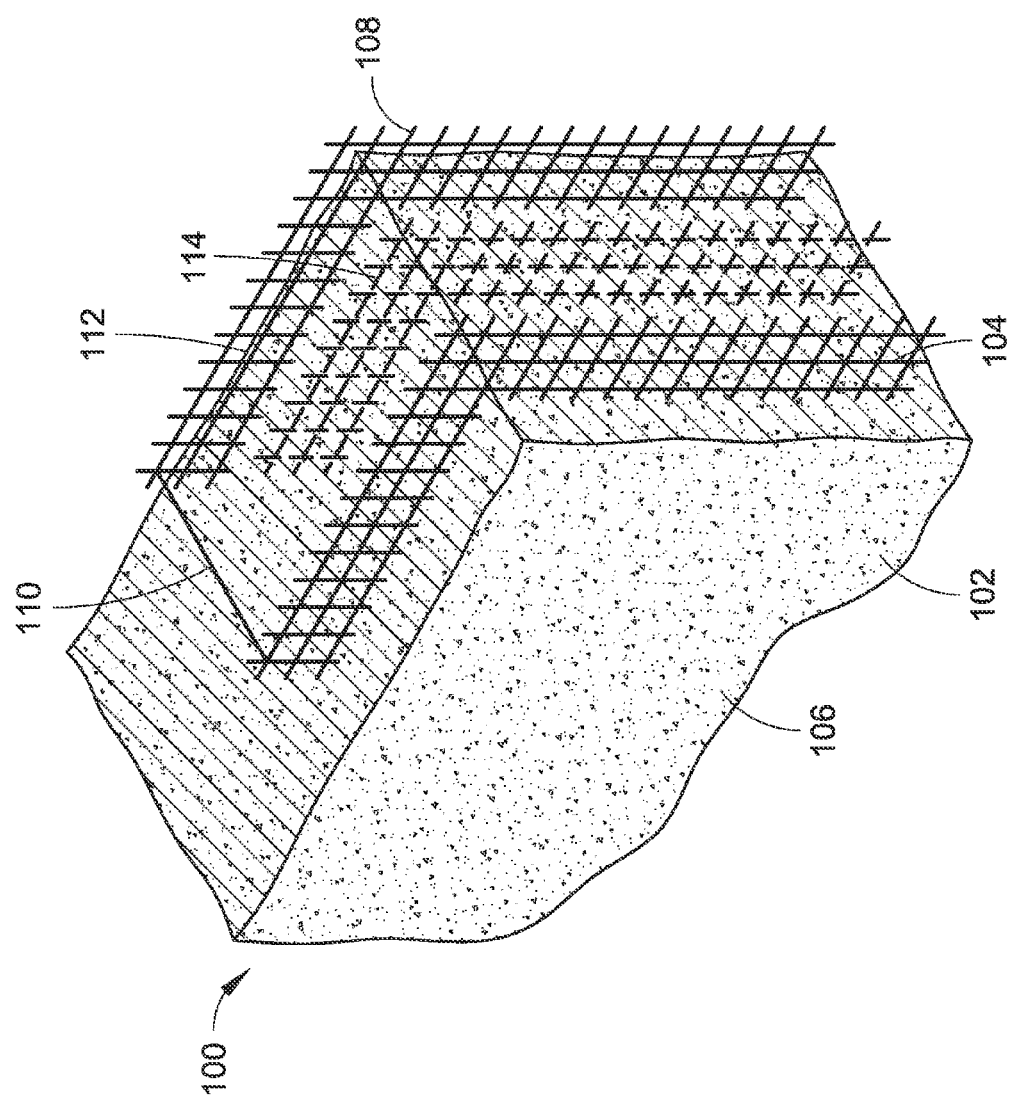

US 9,681,592 B2

STRUCTURAL CONCRETE MIX FOR CONSTRUCTION FOR ELECTROMAGNETIC WAVE/PULSE SHIELDING

FEDERALLY SPONSORED RESEARCH OR DEVELOPMENT

This invention was made with government support under Grant No. HDTRA1-12-C-0047 awarded by the United States Department of Defense (DOD)/Defense Threat Reduction Agency (DTRA). The government has certain rights in the invention.

BACKGROUND

An Electromagnetic Pulse (EMP) is an abrupt pulse or burst of electromagnetic (EM) radiation that typically results from a high energy explosion (e.g., a nuclear explosion) or from a suddenly fluctuating magnetic field, such as a magnetic field generated by a solar flare or coronal mass ejection (CME). An EMP creates rapidly changing electric fields and magnetic fields, which may couple with electrical and electronic systems, resulting in damaging current and voltage surges. For example, a High-altitude Electromagnetic Pulse (HEMP) is produced when a nuclear weapon is detonated high above the Earth's surface, generating gamma radiation that ionizes the atmosphere and creates an instantaneous and intense EM field. The effects of a HEMP vary depending on a number of factors, including detonation altitude, energy yield, gamma ray output, interactions with the Earth's magnetic field, shielding effectiveness of targets, and so forth. As the EM field of a HEMP radiates outward, it can overload electronic devices and equipment with effects similar to (but causing damage more quickly than) a lightning strike. EMP weapons have also been developed that can be mounted on aircraft and carried by ground vehicles.

SUMMARY

Conductive concrete mixtures are described that are configured to provide EMP shielding and reflect and/or absorb, for instance, EM waves propagating through the conductive concrete mixture. The conductive concrete mixtures include cement, water, conductive carbon material, magnetic material, and metallic conductive material. The conductive carbon material may include conductive carbon particles, conductive carbon powder, and/or coke breeze. The metallic conductive material may include steel fibers, and the magnetic material may include taconite. The conductive concrete mixture may also include graphite powder, silica fume, and/or other supplementary cementitious materials (SCM) such as fly ash, calcined clay, and ground granular blast furnace slag (GGBFS). The conductive carbon material may comprise from about zero (0) to forty percent (40%) of the conductive concrete mixture by weight, the magnetic material may comprise from about zero (0) to seventy-five percent (75%) of the conductive concrete mixture by weight, and/or the metallic conductive material may comprise from about zero (0) to fifteen percent (15%) of the conductive concrete mixture by weight.

In some embodiments, the conductive carbon material may comprise from about fifteen percent (15%) to twenty percent (20%) of the conductive concrete mixture by weight, the magnetic material may comprise from about twenty-five percent (25%) to fifty-five percent (55%) of the conductive concrete mixture by weight, and the metallic conductive material may comprise from about five percent (5%) to ten percent (10%) of the conductive concrete mixture by weight. A method of making a concrete structure includes pouring a concrete mixture to form conductive concrete, and positioning a first conductive screen within the conductive concrete proximate to an exterior surface of the conductive concrete. The method also includes positioning a second conductive screen within the conductive concrete in electrical contact with the first conductive screen. In some embodiments, a third conductive screen may be placed within the conductive concrete in electrical contact with the first two conductive screens. One or more of the conductive screens may comprise welded wire fabric (WWF), welded wire rebar (WWR), a fine metal screen, and/or various combinations thereof.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

FIG. 1A is a partial cross-sectional isometric view illustrating a concrete structure formed using conductive concrete mixture and conductive screens in accordance with example embodiments of the present disclosure.

DETAILED DESCRIPTION

Figure 1B:
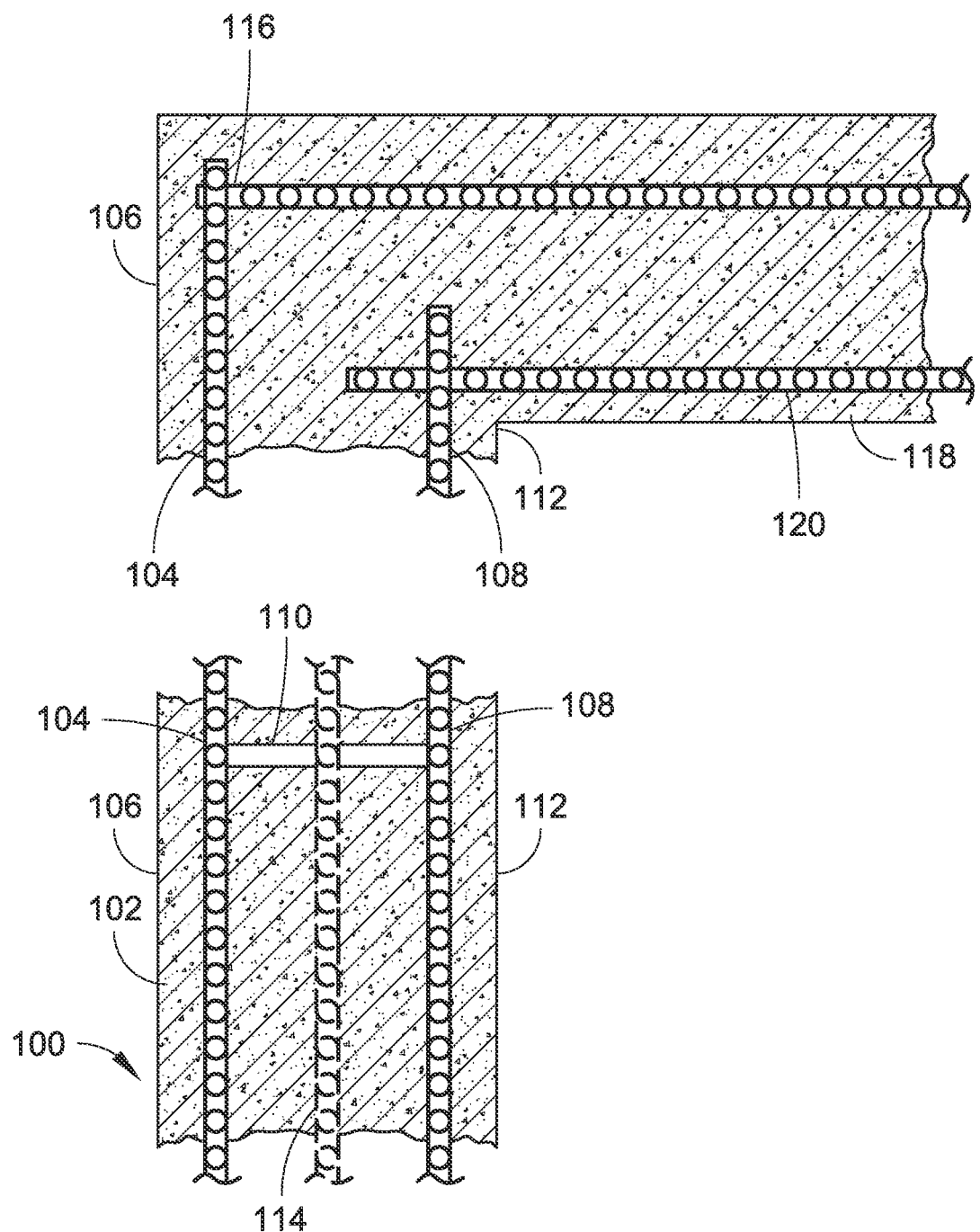
FIG. 1B is a partial end elevation view illustrating a concrete structure formed using conductive concrete mixture and conductive screens in accordance with example embodiments of the present disclosure.

EMP protection is desirable for facilities and infrastructure employed for critical services, such as Command and Control (C²), Command and Control Information Systems (C²IS), Command, Control, Communications, Computers, Intelligence, Surveillance, and Reconnaissance (C⁴ISR), financial institutions, and so forth. For example, the military is concerned with ensuring that military commanders have the ability to direct forces, while financial institutions are concerned with protecting computer networks and databases crucial to electronic business (e-business). Thus, critical facilities and infrastructure are typically protected from EMP's by shielding and grounding building structures using a shielded enclosure or Faraday cage around a facility. For example, a Faraday cage can be formed as an enclosure using metallic conducting material (e.g., solid steel panels) or a mesh of conducting material (e.g., copper wire screen) surrounding a facility. However, such shielding must be constructed in addition to the facility itself, adding to the cost and complexity of providing EMP protection.

Accordingly, the present disclosure is directed to a conductive concrete building material that can provide built-in shielding against EMP, as well as EM field immunity and radiated emission security. For example, while concrete with embedded steel rebar can provide some magnetic shielding, a conductive concrete enclosure configured in accordance with the present disclosure can provide effective global shielding at frequencies of interest. Further, conductive concrete walls can also provide grounding and lightning protection, and conduct the energy of EMP induced current, which would otherwise be conducted in wires and other conductors within a structure. Additionally, use of the conductive concrete material may provide a more cost-effective building option (e.g., instead of constructing separate shielding in the manner of a Faraday cage). The conductive concrete material and/or construction techniques described herein can be used to minimize (e.g., prevent) electronic signals from exiting a structure and/or entering a structure. In some embodiments, the conductive concrete material and/or construction techniques of the present disclosure can be used to construct a sensitive compartmented information facility (SCIF), where sensitive compartmented information (SCI) can be stored, electronically processed, and so forth. However, it should be noted that a sensitive compartmented information facility is provided by way of example only and is not meant to limit the present disclosure. In other embodiments, the conductive concrete material and/or construction techniques of the present disclosure can be used to construct another shielded environment, including, but not necessarily limited to: a shielded room for a magnetic resonance imaging (MRI) facility that provides magnetic field shielding, a radio frequency anechoic chamber that provides shielding against external EM fields and EM absorption of internal EM fields, and so forth.

In implementations, the conductive concrete mixture may include one or more magnetic materials, such as ferromagnetic material, paramagnetic material, and so forth, which serve to provide EMP shielding and absorb, for instance, EM waves propagating through the conductive concrete mixture. For example, in a specific instance, the conductive concrete mixture includes a taconite rock material that comprises magnetite, such as a taconite aggregate. However, taconite aggregate is provided by way of example only and is not meant to limit the present disclosure. Thus, in other implementations, the conductive concrete mixture may include other materials, such as, but not necessarily limited to: natural geological materials, mineral materials, and so forth. For example, the conductive concrete mixture may include meteoric iron (e.g., iron from nickel-iron meteorites) having kamacite and/or taenite minerals. The conductive concrete mixture may also include magnetite crystals produced by bacteria and/or magnetite collected from river or beach sands. Further, the conductive concrete mixture may include titanohematite and/or pyrrhotite (which may be ground into a powder). In still further instances, the conductive concrete mixture may include a paramagnetic mineral, such as ilmenite, titanomagnetite, and so forth.

The conductive concrete mixture also includes one or more conductive materials configured to furnish electrical conductivity to the concrete. The conductive material serves to provide EMP shielding and reflect and absorb, for instance, EM waves propagating through the conductive concrete mixture. For example, the conductive concrete mixture may include at least substantially uniformly distributed conductive materials, which may include metallic and possibly non-metallic conductive materials, such as metal and/or carbon fibers. In implementations, the metallic conductive material may serve to reflect EM waves, while the non-metallic conductive material may serve to absorb EM waves. For the purposes of the present disclosure, a conductive concrete mixture may be defined as a cement-based admixture containing electrically conductive components that furnish a relatively high electrical conductivity to the concrete (e.g., with respect to the electrical conductivity of typical concrete).

The conductive concrete mixture may include conductive carbon particles, such as carbon powder, and so forth, which may furnish electrically conductive paths between portions of the conductive material, achieving, for instance, an effective reflective-wire-mesh structure in the concrete. In some embodiments, graphite and carbon granules are used with the conductive concrete mixture. These granules can have sizes such as minus three-eighths of an inch (–⅜ in.) as measured by sieve analysis with ten millimeter (10 mm) to two-tenths of a millimeter (0.2 mm) mesh sizes, and so forth. In some embodiments, a baked carbon additive is used with the conductive concrete mixture. In some embodiments, a graphite carbon additive is used with the conductive concrete mixture.

In implementations, the conductive concrete mixture includes a metallic conductive material. For example, the metallic conductive material may be a steel material (e.g., bare steel, galvanized steel) or a combination of steel materials, such as one inch (1 in.) long steel fibers, one and one-half inch (1.5 in.) long steel fibers, fine steel fibers, steel wool fibers, steel powder, and so forth. In some embodiments, low carbon steel fibers having aspect ratios from about eighteen (18) to fifty-three (53) can be used to form the conductive concrete mixture. These fibers may be rectangular in cross-section and may have a deformed and/or corrugated surface to aid in bonding with the concrete material. For example, low carbon, cold drawn steel wire fibers having variable equivalent diameters and a continuously deformed shape can be used. The steel wire fibers can have various lengths (e.g., about thirty-eight millimeters (38 mm), about fifty millimeters (50 mm), and so forth) and/or aspect ratios (e.g., about thirty-four (34), about forty-four (44), and so on). In some embodiments, steel fibers are used that have lengths from about thirteen millimeters (13 mm) to fifty millimeters (50 mm).

It should be noted that the steel fibers can have various shapes, including, but not necessarily limited to: straight, wavy, end-deformed, and so forth. Further, steel fibers are provided by way of example only and are not meant to limit the present disclosure. Thus, other metallic conductive materials may also be utilized, including metal particles, such as steel shavings, which may have varying diameters. In some embodiments, fine steel wool fibers and/or powder having a size of about six-tenths of a centimeter (0.6 cm) is used with the conductive concrete mixture. Further, metallic conductive strands and/or coils can be used. Additionally, the conductive concrete mixture may include conductive aggregates, such as iron ore and/or slag. In some instances, copper-rich aggregates can be used. It should be noted that using conductive aggregates may reduce the amount of conductive fibers necessary to maintain stable electrical conductivity. Additionally, a chemical admixture may be added to the aggregate to enhance electrical conductivity and reduce the amount of conductive fibers.

One-quarter inch (0.25 in.) thick test specimens made of cement, carbon powder, and very fine steel fibers were evaluated according to the ASTM-4935-99 Shielding Effectiveness (SE) test fixture. The measurements of the reference and load specimens were obtained using a radio frequency (RF) network analyzer. SE has been determined as the difference in decibels (dB) between the insertion loss measurements of the reference and load specimens. The results showed an SE better than sixty decibels (60 dB) at three hundred kilohertz (300 kHz) that decreased at ten decibels (10 dB) per decade frequency to about thirty decibels (30 dB) at three hundred megahertz (300 MHz), before improving at about ten decibels (10 dB) per decade above three hundred (300 MHz). This frequency response suggests that the SE is due to both reflection (e.g., at low frequency) and absorption (e.g., at high frequency).

One-quarter inch (0.25 in.) thick test specimens made of typical cement were also evaluated according to the ASTM-4935-99 SE test fixture. Measurements with the RF network analyzer showed an average SE of less than five decibels (5 dB) over the frequency range from three-tenths megahertz (0.3 MHz) to three gigahertz (3 GHz). Thus, it may be seen that the cement-only specimens provide essentially no shielding between one megahertz (1 MHz) and one hundred megahertz (100 MHz). In comparison, specimens that are of the same thickness but contain fine steel fibers and carbon powder may yield SE better than thirty decibels (30 dB) over the same frequency range. The comparative results of these two sample mixtures indicate the application of conductive concrete for providing electromagnetic shielding of structures. Further, the measurements from cement-only specimens can be used to provide baseline SE results for further comparison with other conductive mix designs at various thicknesses.

One-quarter inch (0.25 in.) thick specimens containing cement, taconite powder, and fine steel fibers were evaluated according to the ASTM-4935-99 SE test fixture. Measurements with the RF network analyzer showed a low frequency SE of nearly fifteen decibels (15 dB) from three-tenths megahertz (0.3 MHz) to twenty megahertz (20 MHz) that increased to about twenty-five decibels (25 dB) between two hundred megahertz (200 MHz) and seven hundred megahertz (700 MHz). The SE improved at sixty decibels (60 dB) per decade in the microwave frequency range and reached greater than fifty decibels (50 dB) at two gigahertz (2 GHz). Thus, it may be seen that the taconite and steel fiber concrete mixture possesses superior SE characteristics compared to the cement-only mixture as described above. It should be noted that the lesser SE of this mixture at low frequency as compared to the carbon powder and fine steel fiber specimens may be attributable to the role of carbon powder versus taconite in providing electrically conductive paths between random steel fibers to achieve a more effective, reflective wire mesh-like structure in the concrete. The SE improvement in the microwave frequency range in the same comparison demonstrates the enhanced effectiveness of taconites as microwave absorbing aggregates. These results also show that the taconite specimens can absorb some electromagnetic energy at lower frequency, indicating that the conductive concrete mixture can also provide low frequency magnetic shielding.

One cubic yard of a conductive concrete mixture in accordance with the present disclosure may be formulated as follows:

| Material | Pounds | Percent |
|---|---|---|
| Hydraulic cement | 707 | 16.7% |
| Silica fume | 41 | 0.9% |
| Taconite sand (2 mm max particle size) | 1023 | 24.1% |
| Taconite coarse aggregate (25 mm max particle size) | 1125 | 26.5% |
| Carbon powder (0.5 mm max particle size) | 121 | 2.9% |
| Carbon particles (10 mm max particle size) | 509 | 12.0% |
| Water | 422 | 10.0% |
| Steel fiber (1 in.) | 122 | 2.9% |
| Steel fiber (1.5 in.) | 100 | 2.3% |
| Steel fiber (fine)/steel shavings | 75 | 1.8% |

A conductive concrete mixture formulated as described may have mechanical strength characteristics such as a twenty-eight (28) day compressive strength ranging from about four thousand five hundred pounds per square inch (4,500 psi) to seven thousand pounds per square inch (7,000 psi), and a flexural strength ranging from about eight hundred pounds per square inch (800 psi) to one thousand five hundred pounds per square inch (1,500 psi). In implementations, the purity of the conductive carbon particles and graphite particles is at least approximately ninety-six percent (96%). It should be noted that coke breeze (a product from coal mines with about eighty percent (80%) fixed carbon) may be used in place of and/or in addition to high purity carbon. For example, the conductive concrete mixture described with reference to the table above may be formulated using about six hundred and thirty pounds (630 lbs.) of coke breeze or about 14.9% of the conductive concrete mixture by weight. It should also be noted that the specific amounts described above are provided by way of example only and are not meant to limit the present disclosure. Thus, other amounts of material may be used for a specified SE in accordance with the present disclosure.

In some embodiments, hydraulic cement may comprise from about fifteen percent (15%) to twenty-one percent (21%) of the conductive concrete mixture by weight; silica fume may comprise from about nine-tenths percent (0.9%) to one and five-tenths percent (1.5%) of the conductive concrete mixture by weight; taconite sand may comprise from about eighteen percent (18%) to twenty-four and one-tenth percent (24.1%) of the conductive concrete mixture by weight; taconite coarse aggregate may comprise from about twenty percent (20%) to twenty-six and five-tenths percent (26.5%) of the conductive concrete mixture by weight; conductive carbon particles may comprise from about ten percent (10%) to twelve percent (12%) of the conductive concrete mixture by weight; conductive carbon powder may comprise from about one percent (1%) to two and nine-tenths percent (2.9%) of the conductive concrete mixture by weight; water may comprise from about nine and one-half percent (9.5%) to ten percent (10%) of the conductive concrete mixture by weight; and steel fibers may comprise from about one and one-half percent (1.5%) to seven percent (7%) of the conductive concrete mixture by weight.

Further, the amounts of materials having different particle sizes may vary as well. For example, in implementations, conductive carbon powder having a maximum particle size of five-tenths of a millimeter (0 5 mm) may comprise from about one-half percent (0.5%) to two and nine-tenths percent (2.9%) of the conductive concrete mixture by weight; conductive carbon particles having a maximum particle size of ten millimeters (10 mm) may comprise from about seven percent (7%) to twelve percent (12%) of the conductive concrete mixture by weight; one inch (1 in.) long steel fibers may comprise from about two percent (2%) to two and nine-tenths percent (2.9%) of the conductive concrete mixture by weight; one and one-half inch (1.5 in.) long steel fibers may comprise from about two percent (2%) to two and three-tenths percent (2.3%) of the conductive concrete mixture by weight; and fine steel fiber may comprise from about zero (0) to two percent (2%) of the conductive concrete mixture by weight.

Referring now to FIGS. 1A and 1B, a concrete structure 100 is described in accordance with example embodiments of the present disclosure. The concrete structure 100 includes conductive concrete 102 formed from a concrete mixture as described herein. The concrete structure 100 also includes a first conductive screen 104 disposed within the conductive concrete 102 and positioned close (e.g., proximate) to an exterior surface 106 of the conductive concrete 102. In embodiments of the disclosure, the first conductive screen 104 is positioned at a distance of less than at least approximately three inches (3 in.) or eight centimeters (8 cm) from the exterior surface 106 of the conductive concrete 102. For example, the first conductive screen 104 can be positioned at a distance from the exterior surface 106 of at least approximately 0.0 cm, 0.2 cm, 0.4 cm, 0.6 cm, 0.8 cm, 1.0 cm, 1.2 cm, 1.4 cm, 1.6 cm, 1.8 cm, 2.0 cm, 2.2 cm, 2.4 cm, 2.6 cm, 2.8 cm, 3.0 cm, 3.2 cm, 3.4 cm, 3.6 cm, 3.8 cm, 4.0 cm, 4.2 cm, 4.4 cm, 4.6 cm, 4.8 cm, 5.0 cm, 5.2 cm, 5.4 cm, 5.6 cm, 5.8 cm, 6.0 cm, 6.2 cm, 6.4 cm, 6.6 cm, 6.8 cm, 7.0 cm, 7.2 cm, 7.4 cm, 7.6 cm, 7.8 cm, 8.0 cm, and so forth.

The concrete structure 100 also includes a second conductive screen 108 disposed within the conductive concrete 102 and in electrical contact with the first conductive screen 104. For example, the first conductive screen 104 and the second conductive screen 108 are connected together using a conductive tie 110 (e.g., a steel twister-tie). However, the conductive tie 110 is provided by way of example only and is not meant to limit the present disclosure. For example, in other embodiments, the first conductive screen 104 and the second conductive screen 108 can be welded together. In embodiments of the disclosure, the volume of one inch (1 in.) and one and a half inch (1.5 in.) steel fibers randomly oriented in the conductive concrete 102 make contact with the conductive screens to form a "loosely connected" metal shield embedded in the conductive concrete, which provides shielding against low-frequency (e.g., one hundred megahertz (100 MHz) or less) EMP. It should also be noted that multiple layers of conductive screens can also enhance high frequency (e.g., one hundred megahertz (100 MHz) or greater) SE.

The second conductive screen 108 can be positioned close (e.g., proximate) to an exterior surface 112 of the conductive concrete 102 (e.g., another exterior surface generally opposite the exterior surface 106). In some embodiments, the second conductive screen 108 is positioned at a distance of less than at least approximately three inches (3 in.) or eight centimeters (8 cm) from the exterior surface 112 of the conductive concrete 102. For example, the second conductive screen 108 can be positioned at a distance from the exterior surface 112 of at least approximately 0.0 cm, 0.2 cm, 0.4 cm, 0.6 cm, 0.8 cm, 1.0 cm, 1.2 cm, 1.4 cm, 1.6 cm, 1.8 cm, 2.0 cm, 2.2 cm, 2.4 cm, 2.6 cm, 2.8 cm, 3.0 cm, 3.2 cm, 3.4 cm, 3.6 cm, 3.8 cm, 4.0 cm, 4.2 cm, 4.4 cm, 4.6 cm, 4.8 cm, 5.0 cm, 5.2 cm, 5.4 cm, 5.6 cm, 5.8 cm, 6.0 cm, 6.2 cm, 6.4 cm, 6.6 cm, 6.8 cm, 7.0 cm, 7.2 cm, 7.4 cm, 7.6 cm, 7.8 cm, 8.0 cm, and so forth.

In some embodiments, the concrete structure 100 can include a third conductive screen 114 disposed within the conductive concrete 102 between the first conductive screen 104 and the second conductive screen 108, e.g., where the third conductive screen 114 is in electrical contact with the first conductive screen 104 and the second conductive screen 108. For example, the third conductive screen 114 can be connected to the first conductive screen 104 and/or the second conductive screen 108 using a conductive tie 110 (e.g., a steel twister-tie). In other embodiments, the third conductive screen 114 and the first conductive screen 104 and/or the second conductive screen 108 can be welded together. In an example embodiment where the conductive concrete 102 forms a wall twelve inches (12 in.) thick, a first conductive screen 104 is positioned about two inches (2 in.) from an exterior surface 106 of the conductive concrete 102, a second conductive screen 108 is positioned about two inches (2 in.) from an exterior surface 112 of the conductive concrete 102, and a third conductive screen 114 is positioned in the middle of the wall, about four inches (4 in.) from each of the first conductive screen 104 and the second conductive screen 108. It should be noted that more than three conductive screens can be disposed within the conductive concrete 102 (e.g., four (4) conductive screens, five (5) conductive screens, six (6) conductive screens, and so forth). All of these conductive screens can be in electrical contact with one another.

With reference to FIG. 1B, the first conductive screen 104 and/or the second conductive screen 108 (and possibly the third conductive screen 114 and/or other conductive screens) can also be in electrical contact with one or more additional conductive screens, which can be disposed in the conductive concrete 102 or another concrete material. In embodiments of the disclosure, these various conductive screens can be disposed in concrete features that extend along different planes and/or in different directions (e.g., horizontally and vertically). For example, the first conductive screen 104 can be a vertically-extending screen connected (e.g., twister-tied, welded) to a horizontally-extending conductive screen 116 disposed in a concrete feature 118. In some embodiments, the concrete feature 118 is also formed from a conductive concrete mixture as described herein. For example, the concrete feature 118 can be formed of the conductive concrete 102. Further, the second conductive screen 108 can be a vertically-extending screen connected (e.g., twister-tied, welded) to a horizontally-extending conductive screen 120 disposed in the concrete feature 118. The third conductive screen 114 can also be connected to a conductive screen disposed in the concrete feature 118 (e.g., connected to a horizontally-extending conductive screen between the conductive screen 116 and the conductive screen 120). In this manner, various conductive screens (e.g., 104, 108, 114, 116, 120, and so forth) can be in electrical contact with one another.

The conductive screen 116 and/or the conductive screen 120 disposed within the concrete feature 118 can also be positioned close (e.g., proximate) to an exterior surface of the concrete feature 118. In embodiments of the disclosure, the conductive screen 116 and/or the conductive screen 120 can be positioned at a distance of less than at least approximately three inches (3 in.) or eight centimeters (8 cm) from one or more exterior surfaces of the concrete feature 118. For example, the conductive screen 116 and/or the conductive screen 120 can be positioned at a distance from an exterior surface of at least approximately 0.0 cm, 0.2 cm, 0.4 cm, 0.6 cm, 0.8 cm, 1.0 cm, 1.2 cm, 1.4 cm, 1.6 cm, 1.8 cm, 2.0 cm, 2.2 cm, 2.4 cm, 2.6 cm, 2.8 cm, 3.0 cm, 3.2 cm, 3.4 cm, 3.6 cm, 3.8 cm, 4.0 cm, 4.2 cm, 4.4 cm, 4.6 cm, 4.8 cm, 5.0 cm, 5.2 cm, 5.4 cm, 5.6 cm, 5.8 cm, 6.0 cm, 6.2 cm, 6.4 cm, 6.6 cm, 6.8 cm, 7.0 cm, 7.2 cm, 7.4 cm, 7.6 cm, 7.8 cm, 8.0 cm, and so forth.

One or more of the conductive screens may comprise a network, lattice, framework, and so forth of conductive material that defines multiple apertures (e.g., circular openings, elliptical openings, square openings, rectangular openings, hexagonal openings, octagonal openings, and so on). For instance, one or more of the conductive screens can be welded wire fabric (WWF), welded wire rebar (WWR), a fine metal screen, thin wire with a coarse screen, and/or various combinations thereof. For example, a conductive screen can comprise a woven wire mesh defining apertures each having a characteristic opening size of less than at least approximately two-tenths of an inch (0.2 in.). However, this mesh is provided by way of example only and is not meant to limit the present disclosure. In other embodiments, a conductive screen can comprise a mesh having a first group of elongated wires arranged proximate to one another across a second group of elongated wires, where the first elongated wires and the second elongated wires are directly fastened together (e.g., tied, welded) to define apertures each having a characteristic opening size of less than at least approximately three inches (3 in.). For example, light gauge wires, medium gauge wires, heavy gauge wires, rebar, and so forth can be welded together to form a mesh, where the openings between adjacent wires are at least approximately one inch (1 in.) by one inch (1 in.), two inches (2 in.) by two inches (2 in.), three inches (3 in.) by three inches (3 in.), and so forth. Wires can include, but are not necessarily limited to: light gauge wires, medium gauge wires, heavy gauge wires, rebar, and so forth. For example, the conductive screen can be formed using one hundred and ninety-two one-thousandths of an inch (0.192 in.) diameter wire, one-eighth of an inch (⅛ in.) diameter wire, one-quarter inch (¼ in.) diameter rebar (e.g., #2 steel rebar), three-quarters of an inch (¾ in.) diameter rebar (e.g., #6 steel rebar), and so forth.

Each conductive screen can comprise one or more layers of various materials. For example, the first conductive screen 104 and/or the second conductive screen 108 can each comprise two or more layers of woven wire mesh defining apertures each having a characteristic opening size of less than at least approximately one quarter of an inch (0.25 in.). Further, different materials can be used for conductive screens proximate to exterior surfaces of the conductive concrete 102, conductive screens disposed between them, and so on. For example, a first conductive screen 104 positioned two inches (2 in.) from an exterior surface 106 of the conductive concrete 102 comprises WWF, a second conductive screen 108 positioned two inches (2 in.) from an exterior surface 112 of the conductive concrete 102 comprises WWF, and a third conductive screen 114 positioned between them comprises WWR. In these embodiments, the WWFs, the WWR, fibers in the conductive concrete 102, and so forth, can all be electrically interconnected.

Example Process

Figure 2:
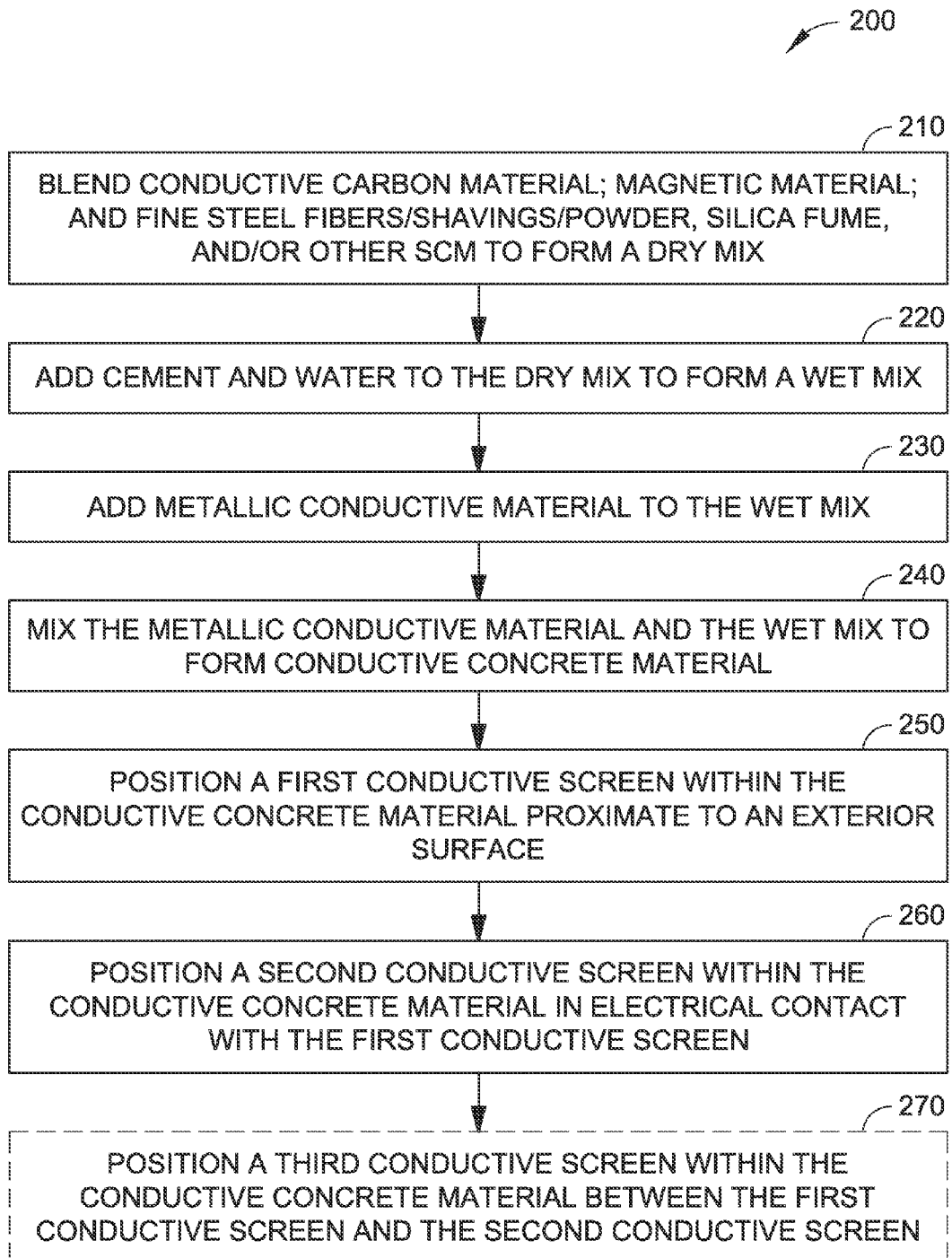
FIG. 2 is a flow diagram illustrating a method for making a concrete structure using conductive concrete mixture and conductive screens in accordance with example embodiments of the present disclosure.

Referring now to FIG. 2, example techniques for making a concrete structure are described. FIG. 2 depicts a process 200, in an example implementation, for making a concrete structure using, for instance, a concrete mixture comprising metallic conductive material, conductive carbon particles, and magnetic material, such as taconite aggregate, as described above, where conductive screens are embedded in the concrete structure.

In the process 200 illustrated, one or more conductive carbon materials (e.g., conductive carbon particles, conductive carbon powder, coke breeze, and so forth); one or more magnetic materials (e.g., crushed taconite aggregate, such as sand and/or gravel); and fine steel fibers/shavings/powder, silica fume, and/or other SCM, are blended to form a dry mix (Block 210). In some embodiments, the materials can be blended in a container such as the drum of a concrete truck mixer, and so forth. However, a concrete truck drum mixer is provided by way of example only, and other containers for mixing concrete may also be used. In some embodiments, the materials of the dry mix are mixed for at least approximately ten (10) minutes. However, this mixing time is provided by way of example and is not meant to limit the present disclosure. In other embodiments, the dry materials are mixed for more than ten (10) minutes or less than ten (10) minutes. For example, the materials of the dray mix can be mixed for at least approximately five (5) minutes. Next, cement (e.g., Type I Portland hydraulic cement) and water are added to the dry mix to form a wet mix (Block 220). Admixtures, such as superplasticizer (e.g., water reducer/High Range Water Reducer (HRWR)) can also be added to the wet mix and/or at the job site. In some embodiments, the wet mix is formed in the concrete truck drum mixer. For example, cement and water are added to the dry ingredients in the drum of the concrete truck mixer from a storage tower at a concrete plant.

Then, metallic conductive material, such as steel fibers, is added to the wet mix (Block 230). For example, steel fibers can be added in the concrete truck mixer using, for instance, a conveyor (e.g., conveyor belt and/or a chute) extending into the concrete truck drum mixer. In embodiments of the disclosure, the steel fibers are spread out to at least substantially uniformly distribute the steel fibers on the conveyor (e.g., to avoid flocculation or balling of the steel fibers and jamming at the chute). For example, the steel fibers can be dumped onto a conveyor belt and/or placed onto the conveyor belt by hand. In some embodiments, alternating batches of differently sized fibers are dumped onto the conveyor belt (e.g., where each batch of one inch (1 in.) long steel fibers alternates with a batch of one and one-half inch (1.5 in.) long steel fibers). Next, the metallic conductive material is mixed with the wet mix to form a conductive concrete mixture (Block 240). In some embodiments, a "fast" mixing speed setting is used for the concrete truck drum mixer, while a "slow" speed setting is used for the conveyor belt. Further, in some embodiments, the concrete truck mixer is directed from the concrete plant to the job site immediately after the metallic conductive material has been loaded into the concrete truck drum mixer.

It should be noted that while process 200 describes adding the metallic conductive material to the wet concrete mixture, the metallic conductive material may be added during the mixing of cement and/or aggregate in either wet or dry conditions. Further, it is desirable to maintain at least substantially uniform disbursement of the metallic conductive material during mixing. Thus, mixing may be performed according to guidelines specified by, for example, American Concrete Institute (ACI) Committee 544 for mixing steel fibers. U.S. Pat. No. 6,825,444, issued Nov. 30, 2004, entitled "Heated Bridge Deck System and Materials and Method for Constructing the Same" includes example mixing procedures that can be used with the conductive concrete mixture of the present disclosure and is incorporated herein by reference in its entirety. In some embodiments, superplasticizer can be added at the job site (e.g., to improve workability) after checking the slump of the concrete. In some embodiments, the slump is maintained at about six inches (6 in.) to seven inches (7 in.) (e.g., to prevent or minimize steel fibers settling to the bottom of the concrete). Further, in some embodiments, vibrators can be used to consolidate the conductive concrete mixture (e.g., in hard to reach spaces and/or between reinforcing bars).

Then, a first conductive screen is positioned within the conductive concrete material proximate to an exterior surface (Block 250). Next, a second conductive screen is positioned within the conductive concrete material in electrical contact with the first conductive screen (Block 260). The second conductive screen can be positioned proximate to another exterior surface. In some embodiments, a third conductive screen is positioned within the conductive concrete material between the first conductive screen and the second conductive screen (Block 270). The third conductive screen can be in electrical contact with the first conductive screen and the second conductive screen. In some embodiments, the conductive screens are stapled and/or tied to metal and/or wood forms to hold them in place while conductive concrete mixture is poured and/or sprayed to form a concrete structure, such as a shelter. For example, the conductive concrete mixture can be conveyed through a hose and pneumatically projected at a high velocity onto a surface (e.g., in the manner of "shotcrete").

An eleven foot (11 ft.) high, eleven foot (11 ft.) wide, and eleven and one-half foot (11.5 ft.) long EMP shelter with nine foot (9 ft.) by nine foot (9 ft.) by nine foot (9 ft.) interior space was constructed using three (3) separate pours of conductive concrete mixture as described herein. The order of construction was a one foot (1 ft.) thick concrete foundation, four (4) nine foot (9 ft.) long concrete walls, and a corrugated roof with a nine inch (9 in.) thick concrete topping. All concrete slabs were twelve inches (12 in.) thick, except the south wall, which was eighteen inches (18 in.) thick. There were two horizontal cold joints in the construction. The shelter included three (3) layers of welded wire fabric (WWF) in the foundation and each of the walls, and two (2) layers of WWF in the nine inch (9 in.) thick topping on the corrugated roof decking. The WWFs were fabricated using wire mesh fencing, with two inch (2 in.) by four inch (4 in.) openings and twelve and one-half (12.5) gauge bare steel wires. An RF shielded door was included in the shelter. The RF door had a three foot (3 ft.) by seven foot (7 ft.) opening. The door was cast in the south wall of the shelter by welding a twelve inch (12 in.) wide, one-quarter inch (¼ in.) thick steel flange all around the door frame. The welds were continuous at the overlapping seams to furnish RF sealing. A steel T-section was welded to the bottom of the RF door frame to support the door assembly.

A first layer of WWF was placed in the form for casting the foundation and welded to the steel door flange. There was a six inch (6 in.) space in front of the door due to the twelve inch (12 in.) wide steel T-section at the bottom, and the south wall thickness was eighteen inches (18 in.) around the door. Two other layers of WWFs were fabricated beforehand and placed into the form at different stages during the foundation pour. The edges of the WWFs were extended upward two feet (2 ft.) along the shelter perimeter to be spliced later with the WWFs in the walls. The form for the foundation pour was set up on a steel deck to provide a level and smooth base. The first layer of WWF was placed at the bottom of the foundation. Conductive concrete mixture was poured six inches (6 in.) deep, and a second layer of WWF was lowered into the position by an overhead crane. The second and third layers of WWFs had perpendicular extensions welded to the door flange for electrical continuity. The third layer of WWF was lowered into place when the depth of the conductive concrete mixture reached twelve inches (12 in.). The third layer of WWF was tapped into the concrete top surface by the weights of the workers. The floor surface was then finished with a bull float. In this example, three layers of WWFs were welded to the door flange to maintain shielding around the door frame.

The form work for casting the four walls of the shelter comprised inner forms, three layers of WWFs, and outer forms. Since the foundation was extended six inches (6 in.) beyond the RF door to support the base of the door, the thickness of the south wall was eighteen inches (18 in.) to simplify the form work. The three layers of WWFs were welded to the door flange and spliced to the WWFs extending from the foundation. The WWFs were welded beforehand to the door flange around the opening in the same manner as the construction for the foundation described previously. Steel snap-ties were extended through the WWF openings at one foot (1 ft.) spacing to tie the inner and outer forms together. This configuration was used to account for concrete pressure exerted on the forms. Shear studs were welded to the door flange to anchor the door in the concrete wall. The walls were poured to a nine foot (9 ft.) height, with the three layers of WWFs extending from the walls for integration with the corrugated roof deck system.

The forms were braced with two inch (2 in.) by four inch (4 in.) lumber, and a catwalk was used for casting the concrete. The overhead crane was used to hoist a one yard (1 yd.) concrete bucket for casting the walls. The bucket provided control over placement of the concrete into the twelve inch (12 in.) wide and nine foot (9 ft.) deep wall cavity between the forms. In this example, four inch (4 in.) by four inch (4 in.) lumber was inserted between adjacent WWF layers to maintain a six inch (6 in.) separation between adjacent layers and account for the momentum of the concrete mixture during the pour. An eight foot (8 ft.) long vibrator was used to facilitate concrete flow through the WWF openings and consolidate the conductive concrete mixture in the forms and between WWF layers (e.g., to prevent or minimize the formation of voids in the walls).

In this example, the momentum of large amounts of conductive concrete mixture dumped from the bucket moved the free-standing WWFs around inside the forms. The four inch (4 in.) by four inch (4 in.) lumber spacers initially kept the WWFs apart, but were removed during the pour due to interference with the concrete placement. The momentum of the concrete pushed the inner (middle) WWF layer toward either the inside WWF layer or the outside WWF layer. When two WWFs came in contact, there was limited space for concrete to flow through, and it became difficult to separate the WWF layers. It should be noted that welded wire reinforcement (e.g., rebar mesh having openings larger than two inches (2 in.) by two inches (2 in.), for example) can be used for the middle layer to account for the momentum of the poured concrete mixture. Further, smaller amounts of concrete (e.g., from a concrete bucket) can be poured at a time to more precisely control the pouring of the concrete into the forms.

Corrugated roof deck panels were used for the roof construction. These panels were made of sixteen (16) gauge (e.g., six one-hundredths of an inch (0.06 in.) thick) galvanized steel, with a three foot (3 ft.) standard width. The panels were interlocked along their edges to form a continuous surface area. The panels were precut to eleven foot (11 ft.) lengths. In this example, four interlocking deck panels covered a twelve foot (12 ft.) by eleven foot (11 ft.) roof area. The bottom of the deck panels was set at the same elevation as the top of the nine foot (9 ft.) walls. The deck panels had a nine inch (9 in.) conductive concrete topping, with two layers of WWFs in the topping. The deck panels were placed on two inch (2 in.) by six inch (6 in.) lumber, which was supported by a steel frame system. A notch at a corrugated end of a deck panel was cut and folded to form an end cap that prevented the conductive concrete mixture from flowing into the shelter. The deck panels were interlocked, cut with a torch to fit in the space between the walls, and welded to the inner WWF layer from the walls. In this manner, the roof deck panels became part of the WWF layer for shielding. Shear studs were spot welded on the deck panel to induce composite action of the deck panel with the conductive concrete mixture (e.g., for structural strength).

When casting the roof, conductive concrete mixture was poured to fill in three inch (3 in.) troughs of the corrugated panels and up to the level of the middle WWF protruding from the walls. A first horizontal WWF layer was then laid on the fresh concrete surface and twister-tied to the middle WWF from the walls. The pour then resumed until the concrete reached the level of the outer WWF from the walls. A second WWF layer was then laid on the fresh concrete and twister-tied to the outer WWF from the walls. The second WWF layer was at about one inch (1 in.) from the rooftop. The pour resumed again to fill concrete to the top of the form. A vibrator was used to facilitate concrete flow through the WWFs. The roof surface was finished with a bull float. During casting, a portable attenuation measurement system (PAMS) showed that the SE crossed eighty decibels (80 dB) during the initial pour over the first WWF layer and reached the one hundred and twenty decibel (120 dB) dynamic range of the PAMS soon after the pour resumed over the second WWF layer. The shoring, outer forms, and catwalk were removed after three days of curing.

Figure 3:
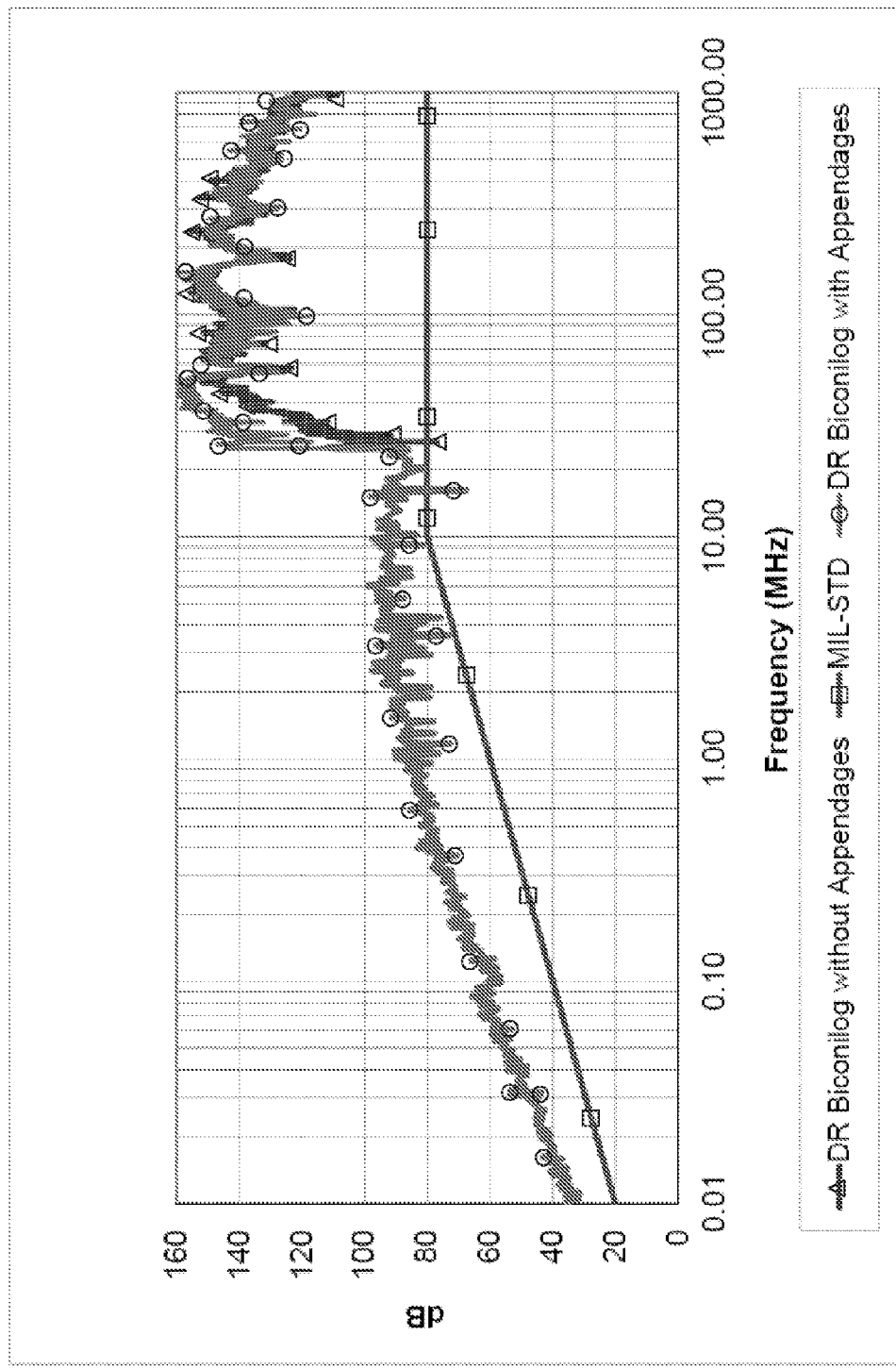
FIG. 3 is a graph illustrating the dynamic range of biconilog antennas used to measure the shielding effectiveness of a concrete shelter constructed in accordance with an example embodiment of the present disclosure.
Figure 4:
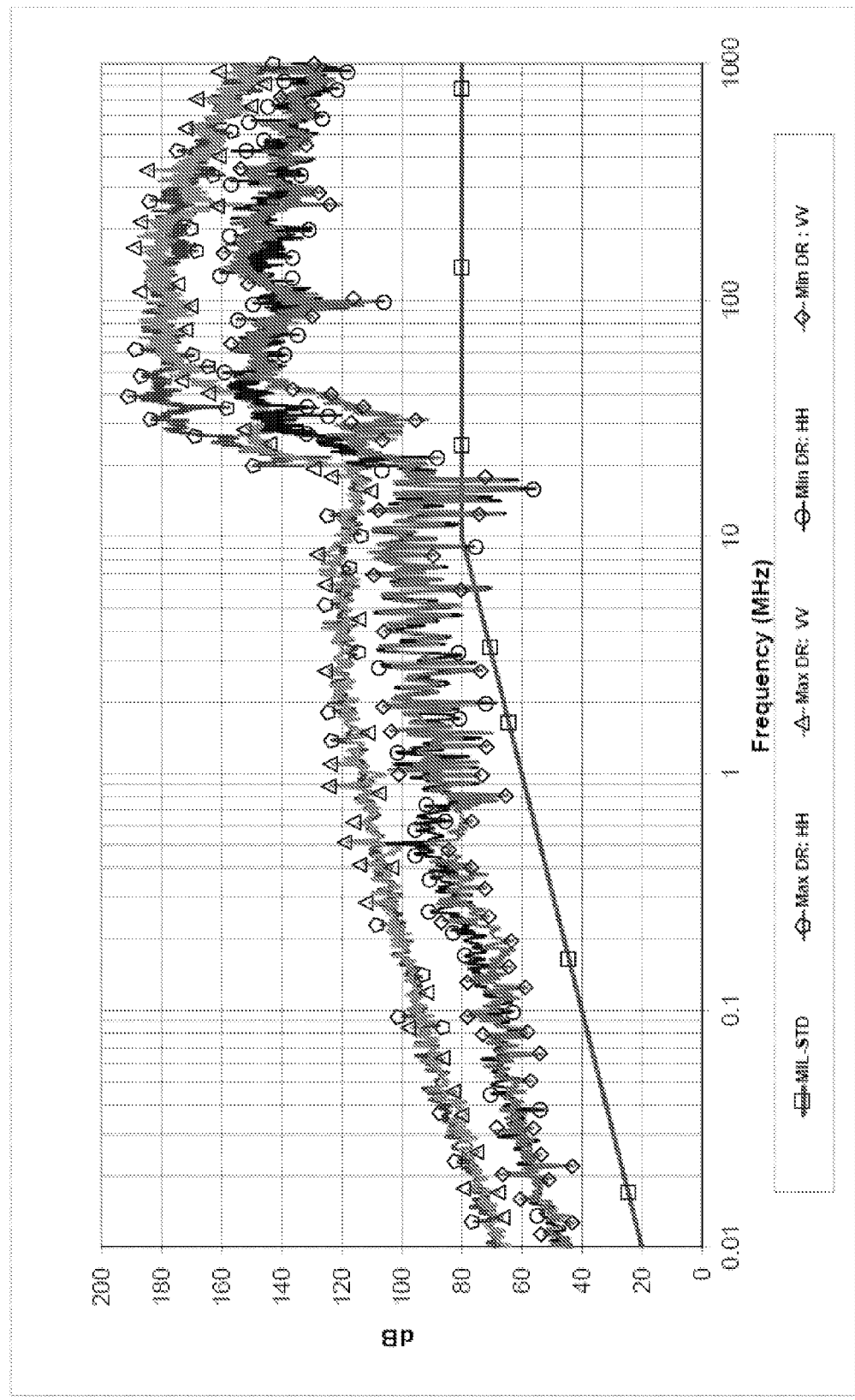
FIG. 4 is a graph illustrating the dynamic range of measurements taken for the concrete shelter measured using the biconilog antennas described with reference to FIG. 3.
Figure 5:
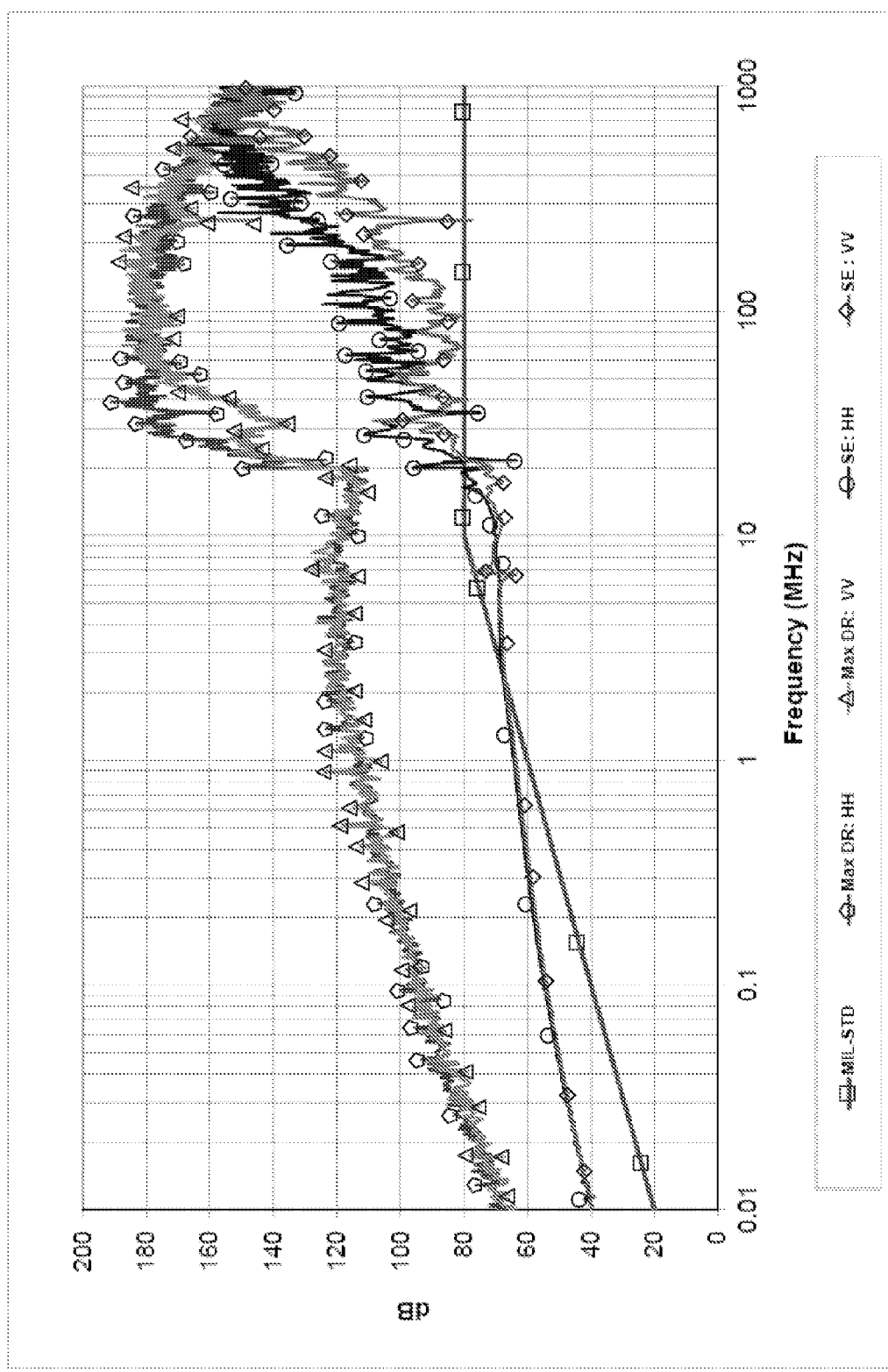
FIG. 5 is a graph illustrating the shielding effectiveness of a west wall of the concrete shelter measured using the biconilog antennas described with reference to FIG. 3.
Figure 6:
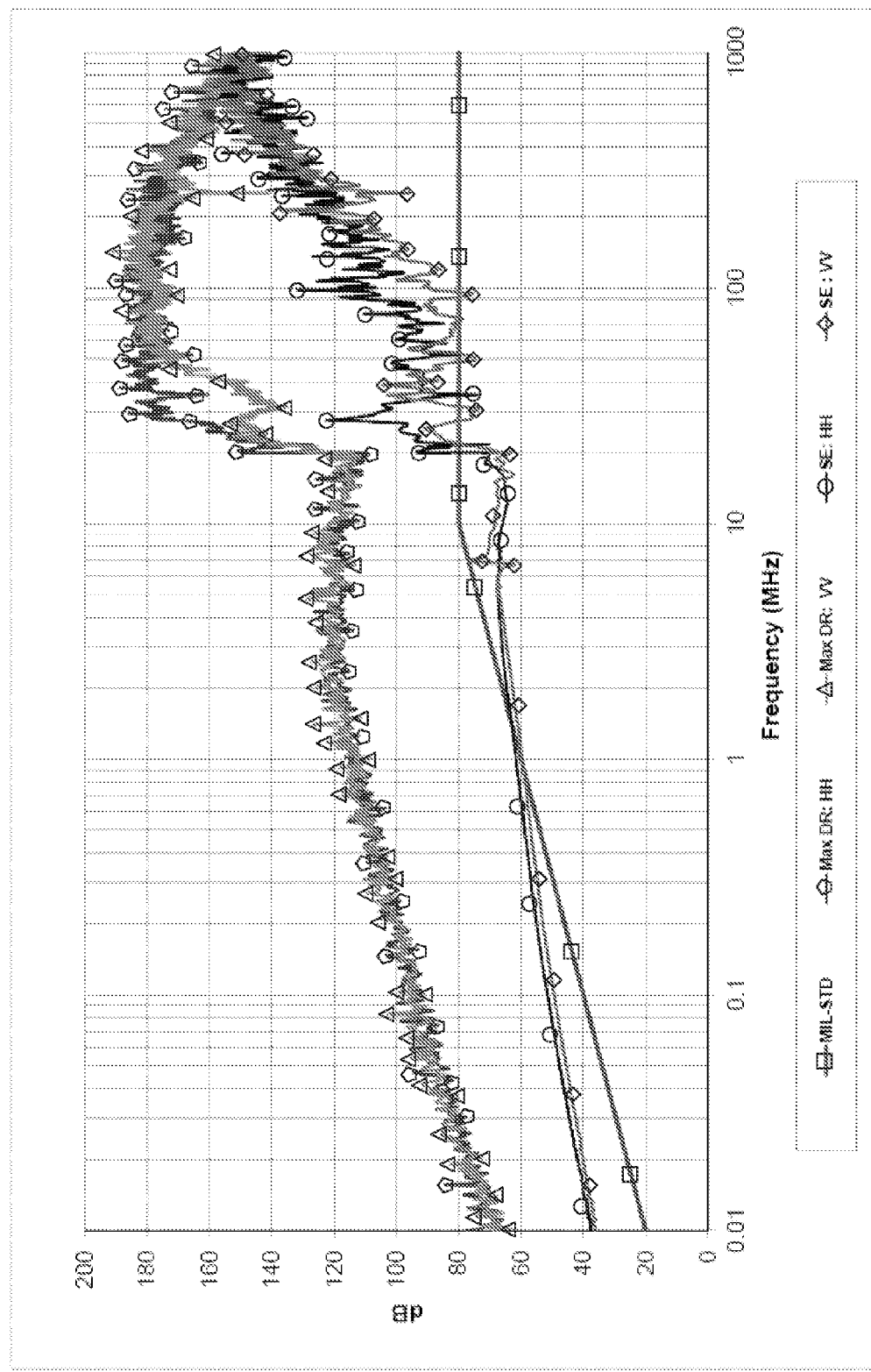
FIG. 6 is a graph illustrating the shielding effectiveness of a north wall of the concrete shelter measured using the biconilog antennas described with reference to FIG. 3.
Figure 7:
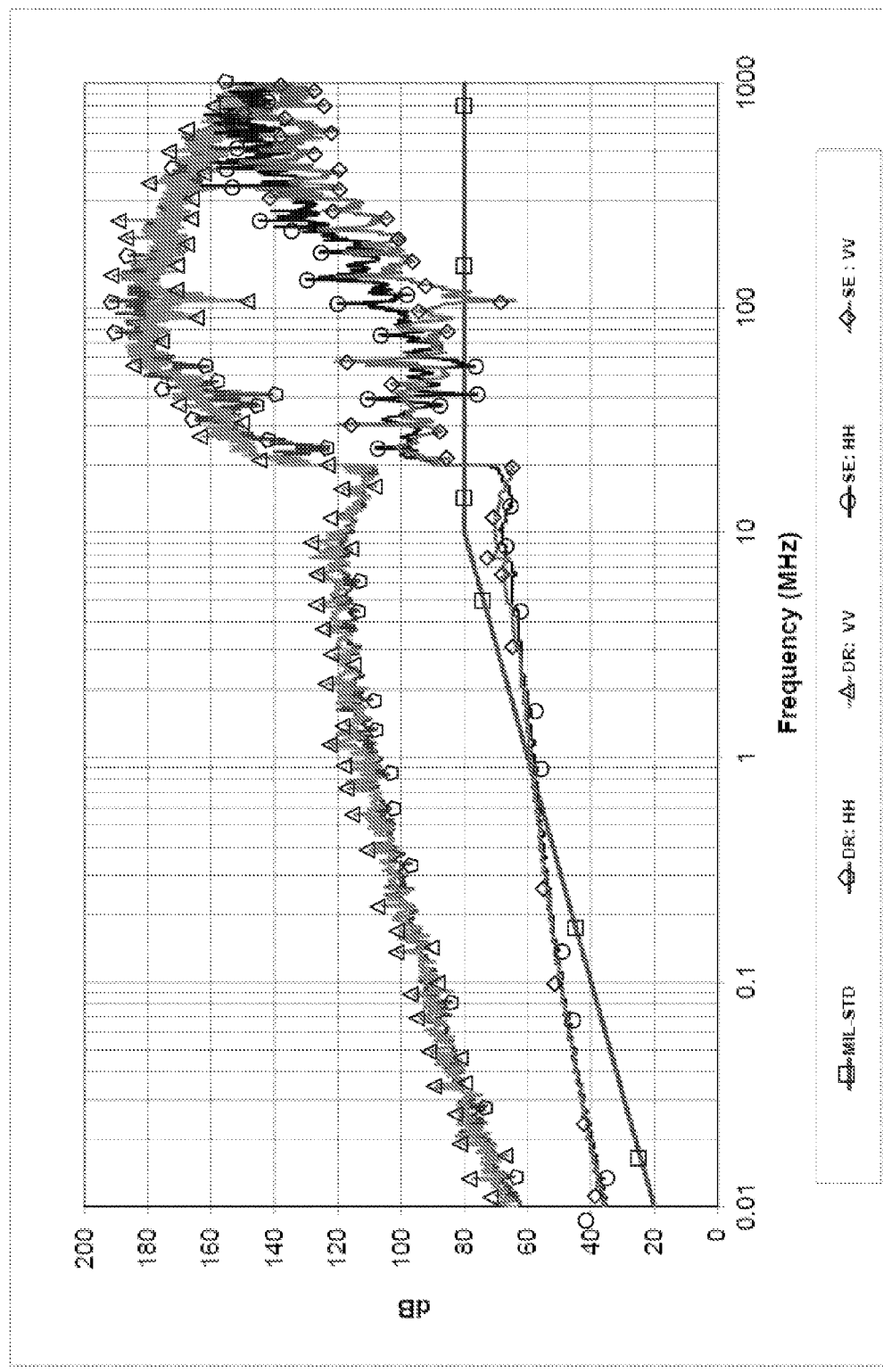
FIG. 7 is a graph illustrating the shielding effectiveness of an east wall of the concrete shelter measured using the biconilog antennas described with reference to FIG. 3.
Figure 8:
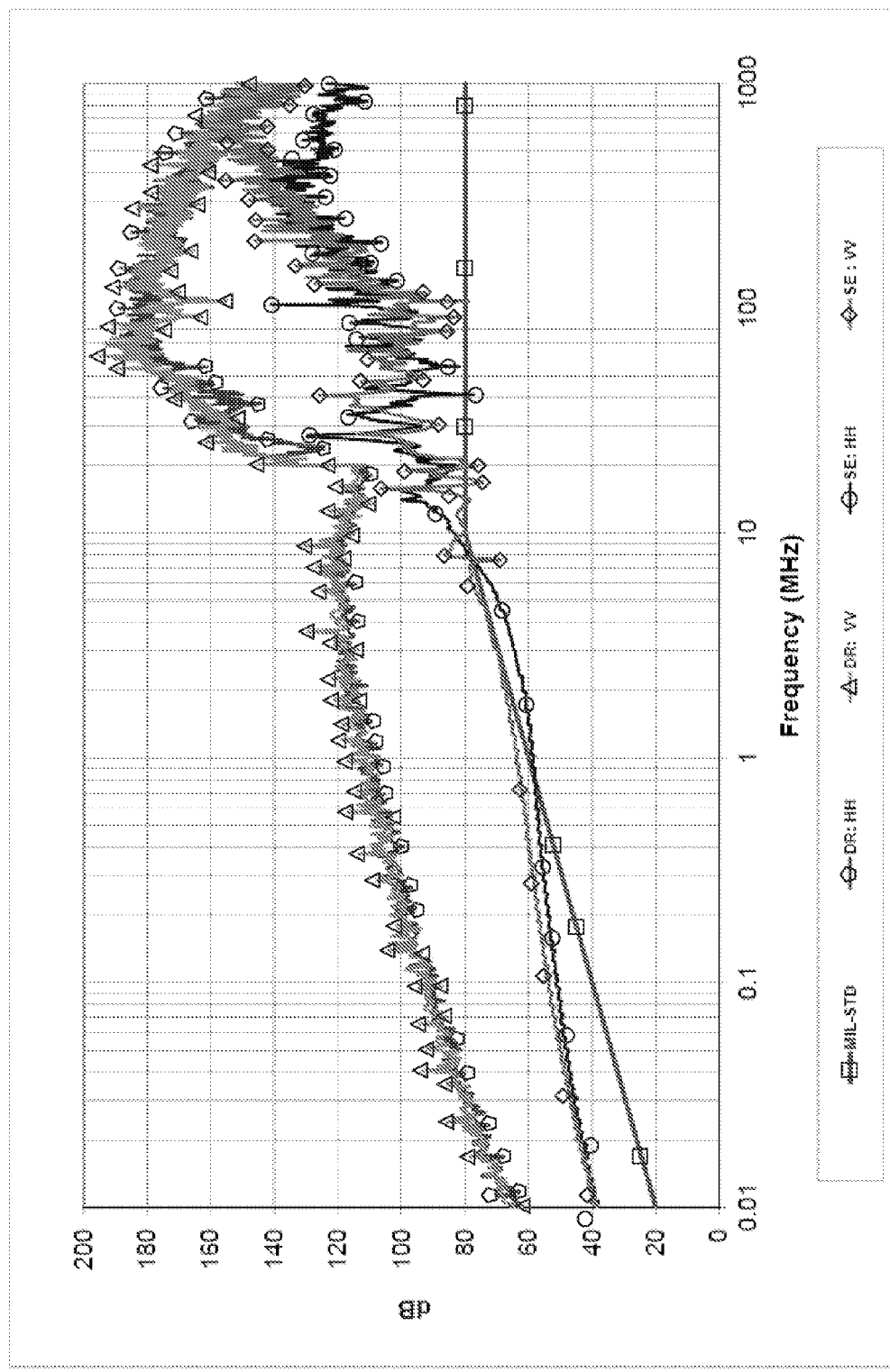
FIG. 8 is a graph illustrating the shielding effectiveness of a south wall of the concrete shelter measured using the biconilog antennas described with reference to FIG. 3.
Figure 9:
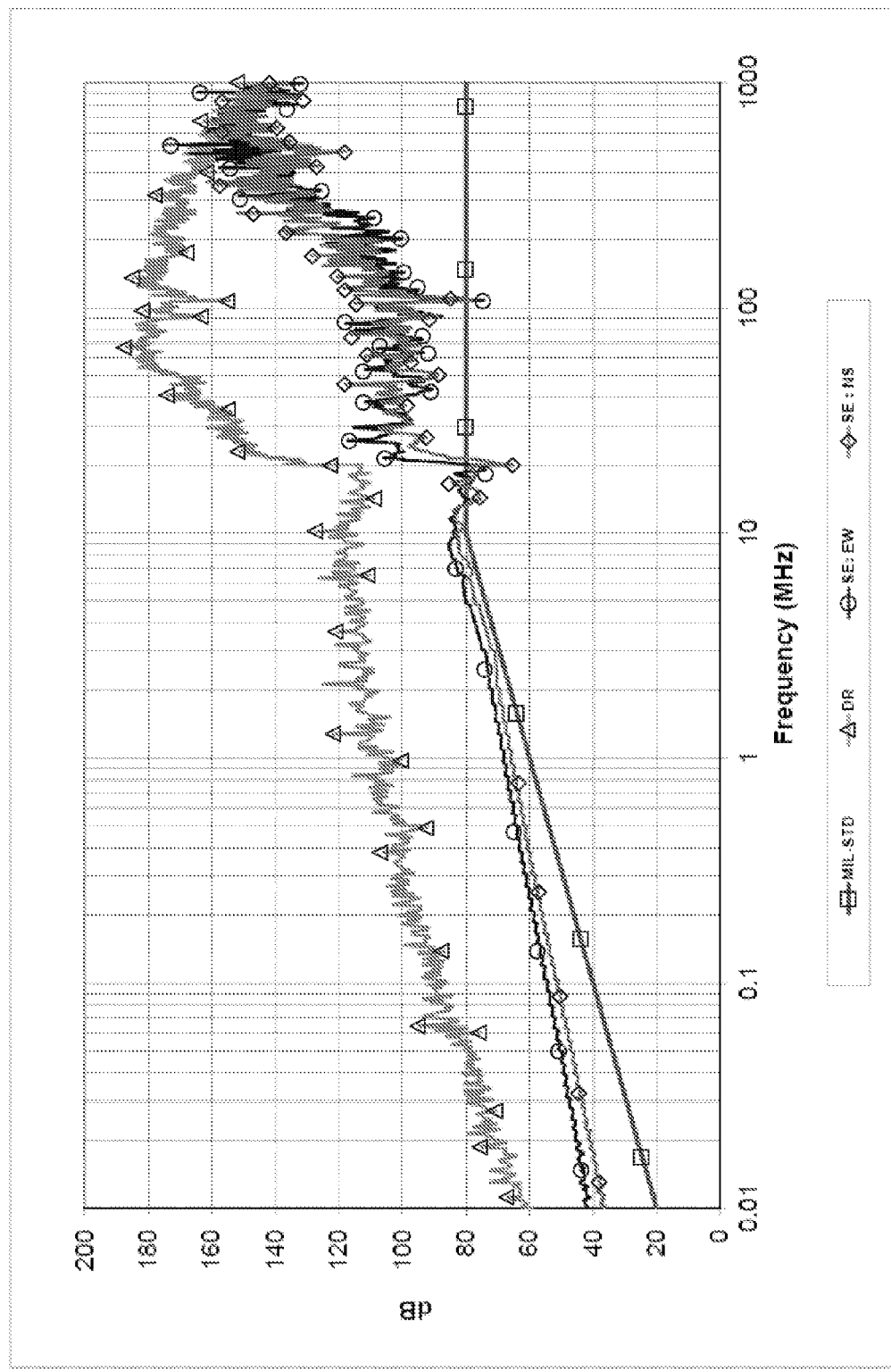
FIG. 9 is a graph illustrating the shielding effectiveness of a rooftop of the concrete shelter measured using the biconilog antennas described with reference to FIG. 3.

Biconilog antennas with appendages were calibrated in the vicinity of the conductive concrete shelter. FIG. 3 plots the dynamic range (DR) of the antennas, using shielded loops for frequencies below twenty-five megahertz (25 MHz). The plots show that the full size (with appendages) biconilog improves the DR over the basic (without appendages) biconilog by at least twenty decibels (20 dB) from twenty-five megahertz (25 MHz) to fifty megahertz (50 MHz). The DR of the loop deteriorates above ten megahertz (10 MHz). FIG. 4 plots the dynamic range (DR) of measurement configurations per MIL-STD 188-125 in horizontal (HH) and vertical (VV) polarizations. The minimum and maximum DRs correspond to the ambient noise levels inside and outside the conductive concrete shelter, respectively. The plots show that the shelter is very quiet; the noise level is about twenty decibels (20 dB) to thirty decibels (30 dB) lower on the inside. These measurements were obtained with the full size biconilog antennas. The appendages to the biconilog antennas were removed in the vertical polarization. Without the appendages, the vertical DR is about thirty decibels (30 dB) lower around thirty megahertz (30 MHz). FIGS. 5 and 6 show the SE measurement results of the shelter through the west and north walls, respectively. The SE plots of the two walls are quite similar overall. FIGS. 7 and 8 show the SE measurement results of the east and south walls, respectively. These measurements were obtained with the base biconilog without the appendages. The plots in FIGS. 5 through 8 show that the conductive concrete shelter has similar SE characteristics for all four walls. FIG. 9 shows the SE measurement results obtained through the rooftop of the conductive concrete shelter. The SE is similar for the rooftop antennas in the east-west and north-south orientation.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A concrete structure, comprising:
   conductive concrete formed from a concrete mixture comprising
      cement,
      water,
      conductive carbon material comprising from at least approximately one percent (1%) to at least approximately twenty percent (20%) of the concrete mixture by weight,
      magnetic material comprising from at least approximately twenty percent (20%) to at least approximately fifty percent (50%) of the concrete mixture by weight, and
      metallic conductive material;
   a first conductive screen disposed within the conductive concrete and positioned proximate to an exterior surface of the conductive concrete; and
   a second conductive screen disposed within the conductive concrete and in electrical contact with the first conductive screen.

2. The concrete structure as recited in claim 1, wherein the first conductive screen is positioned less than at least approximately three inches (3 in.) from the exterior surface of the conductive concrete.

3. The concrete structure as recited in claim 1, wherein the second conductive screen is positioned proximate to a second exterior surface of the conductive concrete, the second exterior surface of the conductive concrete generally opposite the exterior surface of the conductive concrete.

4. The concrete structure as recited in claim 1, wherein at least one of the first conductive screen or the second conductive screen comprises a woven wire mesh defining a plurality of apertures each having a characteristic opening size of less than at least approximately two-tenths of an inch (0.2 in.).

5. The concrete structure as recited in claim 1, wherein at least one of the first conductive screen or the second conductive screen comprises a mesh having a first plurality of elongated wires arranged proximate to one another across a second plurality of elongated wires, the first plurality of elongated wires and the second plurality of elongated wires directly fastened together to define a plurality of apertures each having a characteristic opening size of less than at least approximately three inches (3 in.).

6. The concrete structure as recited in claim 1, further comprising a third conductive screen disposed within the conductive concrete between the first conductive screen and the second conductive screen, the third conductive screen in electrical contact with the first conductive screen and the second conductive screen.

7. The concrete structure as recited in claim 1, wherein the metallic conductive material comprises at least one of steel fibers, steel wool, or steel powder.

8. The concrete structure as recited in claim 1, wherein the magnetic material comprises at least one of taconite, magnetite, kamacite, taenite, titanohematite, pyrrhotite, ilmenite, or titanomagnetite.

9. The concrete structure as recited in claim 1, wherein the conductive carbon material comprises at least one of carbon particles, conductive carbon powder, or coke breeze.

10. The concrete structure as recited in claim 1, wherein the metallic conductive material comprises from at least approximately one percent (1%) to at least approximately fifteen percent (15%) of the concrete mixture by weight.

11. A method of making a concrete structure, comprising:
blending conductive carbon material and magnetic material to a form a dry mix;
adding cement and water to the dry mix to form a wet mix;
adding metallic conductive material to the wet mix;
mixing the metallic conductive material and the wet mix to form a concrete mixture;
pouring the concrete mixture to form conductive concrete;
positioning a first conductive screen within the conductive concrete proximate to an exterior surface of the conductive concrete; and
positioning a second conductive screen within the conductive concrete in electrical contact with the first conductive screen,
wherein the conductive carbon material comprises from at least approximately one percent (1%) to at least approximately twenty percent (20%) of the concrete mixture by weight, and the magnetic material comprises from at least approximately twenty percent (20%) to at least approximately fifty percent (50%) of the concrete mixture by weight.

12. The method as recited in claim 11, wherein the first conductive screen is positioned less than at least approximately three inches (3 in.) from the exterior surface of the conductive concrete.

13. The method as recited in claim 11, wherein the second conductive screen is positioned proximate to a second exterior surface of the conductive concrete, the second exterior surface of the conductive concrete generally opposite the exterior surface of the conductive concrete.

14. The method as recited in claim 11, wherein at least one of the first conductive screen or the second conductive screen comprises a woven wire mesh defining a plurality of apertures each having a characteristic opening size of less than at least approximately two-tenths of an inch (0.2 in.).

15. The method as recited in claim 11, wherein at least one of the first conductive screen or the second conductive screen comprises a mesh having a first plurality of elongated wires arranged proximate to one another across a second plurality of elongated wires, the first plurality of elongated wires and the second plurality of elongated wires directly fastened together to define a plurality of apertures each having a characteristic opening size of less than at least approximately three inches (3 in.).

16. The method as recited in claim 11, further comprising positioning a third conductive screen within the conductive concrete between the first conductive screen and the second conductive screen, the third conductive screen in electrical contact with the first conductive screen and the second conductive screen.

17. The method as recited in claim 11, wherein the metallic conductive material comprises at least one of steel fibers, steel wool, or steel powder.

18. The method as recited in claim 11, wherein the magnetic material comprises at least one of taconite, magnetite, kamacite, taenite, titanohematite, pyrrhotite, ilmenite, or titanomagnetite.

19. The method as recited in claim 11, wherein blending conductive carbon material and magnetic material to form a dry mix further comprises blending conductive carbon particles, conductive carbon powder, crushed taconite aggregate, and supplementary cementitious material (SCM) to form a dry mix.

20. A method of making a concrete structure, comprising:
pouring a concrete mixture to form conductive concrete, the conductive concrete comprising:
cement,
water,
conductive carbon material comprising from at least approximately one percent (1%) to at least approximately twenty percent (20%) of the concrete mixture by weight,
magnetic material comprising from at least approximately twenty percent (20%) to at least approximately fifty percent (50%) of the concrete mixture by weight, and
metallic conductive material;
positioning a first conductive screen within the conductive concrete proximate to an exterior surface of the conductive concrete; and
positioning a second conductive screen within the conductive concrete in electrical contact with the first conductive screen.

21. The method as recited in claim 20, wherein the first conductive screen is positioned less than at least approximately three inches (3 in.) from the exterior surface of the conductive concrete.

22. The method as recited in claim 20, wherein the second conductive screen is positioned proximate to a second exterior surface of the conductive concrete, the second exterior surface of the conductive concrete generally opposite the exterior surface of the conductive concrete.

23. The method as recited in claim 20, wherein at least one of the first conductive screen or the second conductive screen comprises a woven wire mesh defining a plurality of apertures each having a characteristic opening size of less than at least approximately two-tenths of an inch (0.2 in.).

24. The method as recited in claim 20, wherein at least one of the first conductive screen or the second conductive screen comprises a mesh having a first plurality of elongated wires arranged proximate to one another across a second plurality of elongated wires, the first plurality of elongated wires and the second plurality of elongated wires directly fastened together to define a plurality of apertures each having a characteristic opening size of less than at least approximately three inches (3 in.).

25. The method as recited in claim 20, further comprising positioning a third conductive screen within the conductive concrete between the first conductive screen and the second conductive screen, the third conductive screen in electrical contact with the first conductive screen and the second conductive screen.

* * * * *